(12) United States Patent
Karve et al.

(10) Patent No.: US 7,709,331 B2
(45) Date of Patent: May 4, 2010

(54) DUAL GATE OXIDE DEVICE INTEGRATION

(75) Inventors: Gauri V. Karve, Fishkill, NY (US); Srikanth B. Samavedam, Fishkill, NY (US); William J. Taylor, Jr., Clifton Park, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 410 days.

(21) Appl. No.: 11/851,719

(22) Filed: Sep. 7, 2007

(65) Prior Publication Data

US 2009/0068807 A1 Mar. 12, 2009

(51) Int. Cl.
*H01L 21/8234* (2006.01)

(52) U.S. Cl. ............... 438/275; 438/591; 257/E21.625

(58) Field of Classification Search ................ 438/222, 438/226, 275, 591; 257/E21.625
See application file for complete search history.

(56) References Cited

U.S. PATENT DOCUMENTS

| | | | |
|---|---|---|---|
| 6,541,357 B1 | 4/2003 | Inaba | |
| 6,620,664 B2 | 9/2003 | Ma et al. | |
| 6,730,576 B1 | 5/2004 | Wang et al. | |
| 6,787,421 B2 | 9/2004 | Gilmer et al. | |
| 6,830,962 B1 * | 12/2004 | Guarini et al. | 438/149 |
| 6,982,230 B2 | 1/2006 | Cabral, Jr. et al. | |
| 7,087,470 B2 | 8/2006 | Anderson et al. | |
| 7,101,746 B2 * | 9/2006 | Chan et al. | 438/199 |
| 2004/0005749 A1 | 1/2004 | Choi et al. | |
| 2004/0032001 A1 | 2/2004 | Gilmer et al. | |
| 2004/0038538 A1 | 2/2004 | Ho et al. | |
| 2005/0280097 A1 | 12/2005 | Anderson et al. | |
| 2005/0285192 A1 | 12/2005 | Zhu | |
| 2006/0081948 A1 | 4/2006 | Lim et al. | |
| 2006/0138603 A1 | 6/2006 | Cabral, Jr. et al. | |
| 2006/0208323 A1 | 9/2006 | Anderson et al. | |
| 2007/0023817 A1 | 2/2007 | Dao | |

FOREIGN PATENT DOCUMENTS

| | | |
|---|---|---|
| WO | 03054968 A1 | 7/2003 |
| WO | 2004061920 A2 | 10/2003 |
| WO | 2004017403 A1 | 2/2004 |

OTHER PUBLICATIONS

International Search Report and Written Opinion correlating to PCT/US2008/070404, dated Oct. 30, 2008.
C. Capasso, et al., "Thin Strained Si1-xGEx Channel PMOS with TaxCy/HfxZr1-xO2 Fate Dielectric Enabling a Low Power Single Metal Gate CMOS Platform," Austin Silicon Technology Solutions, Freescale.

* cited by examiner

*Primary Examiner*—Chandra Chaudhari
(74) *Attorney, Agent, or Firm*—Kim-Marie Vo; Ranjeev Singh

(57) ABSTRACT

A method of forming devices including forming a first region and a second region in a semiconductor substrate is provided. The method further includes forming a semiconductive material over the first region, wherein the semiconductive material has a different electrical property than the first semiconductor substrate, forming a first dielectric material over the first region, depositing a second dielectric material over the first dielectric material and over the second region, wherein the second dielectric material is different than the first dielectric material, and depositing a gate electrode material over the high dielectric constant material. In one embodiment, the semiconductive material is silicon germanium and the semiconductor substrate is silicon.

20 Claims, 4 Drawing Sheets

DUAL GATE OXIDE DEVICE INTEGRATION

BACKGROUND

1. Field

This disclosure relates generally to semiconductor devices, and more specifically, to dual gate oxide device integration.

2. Related Art

In many instances, dual gate oxide (DGO) devices need to be integrated on the same substrate. As used herein, the term dual gate oxide devices relates to devices that are formed on the same substrate, but have different gate oxide thicknesses. For example, thicker gate oxide devices may be formed on the periphery of the substrate so that they can handle higher voltages associated with input/output operations. Thinner gate oxide devices may be formed in areas of the substrate where higher voltages are not present. Metal gate with high dielectric constant (high k) devices increasingly need materials that may not be compatible with existing methods for forming dual gate oxide devices. For example, such metal gate/high k dielectric devices may need silicon germanium channels to lower the threshold voltage ($V_t$) associated with the PMOS devices. Conventional processes, such as thermal oxidation, used to form thick gate oxide devices, however, are not compatible with silicon germanium channels. This is because if thick gate oxide is grown over silicon germanium, the thermal oxidation step results in the germanium diffusing into the regions of the substrate or the gate oxide that should not contain any germanium. In sum, thermal oxidation step used as part of the conventional dual gate oxide integration process may degrade the profile of the silicon germanium channel.

Accordingly, there is a need for improved dual gate oxide device integration.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Dual gate oxide device integration is described for transistors including a silicon germanium channel. The use of silicon germanium channel helps in adjusting the threshold voltage of PMOS devices, for example. Silicon carbon channels may be used for NMOS devices, as well.

In one aspect, a method of forming devices is provided. The method includes forming a first region and a second region in a semiconductor substrate. The method further includes forming a semiconductive material over the first region, wherein the semiconductive material has a different electrical property than the first semiconductor substrate. The method further includes forming a first dielectric material over the first region. The method further includes depositing a second dielectric material over the first dielectric material and over the second region, wherein the second dielectric material is different than the first dielectric material. The method further includes depositing a gate electrode material over the second dielectric material.

In another aspect, a method of forming devices is provided. The method includes forming a thick gate dielectric device in a first region of a semiconductor substrate, wherein the thick gate dielectric device has a first channel region and the semiconductor substrate comprises a first material. The method further includes forming a thin gate dielectric device in a second region of a semiconductor device, wherein the thin gate dielectric device has a gate dielectric that is thinner than that of the thick gate dielectric, the thin gate dielectric device has a second channel region. Forming the thick gate dielectric device and the thin gate dielectric device further comprises: (1) epitaxially growing the first channel region over the first region, wherein the first channel region comprises a second material, wherein the second material is different from the first material; (2) forming a first gate dielectric over the first channel region; (3) forming a second gate dielectric over the first gate dielectric and the second region; and (4) depositing a gate electrode material over the second gate dielectric.

In yet another aspect, a method including forming an isolation region in a semiconductor substrate to form a first semiconductor region and a second semiconductive region in a semiconductor substrate is provided. The method further includes epitaxially growing a semiconductive material over the first semiconductive region, wherein the semiconductive material comprises an element selected from the group consisting of germanium and carbon. The method further includes depositing a first dielectric material over the first semiconductive region. The method further includes depositing a second dielectric material over the first dielectric material and the second semiconductive region. The method further includes depositing a gate electrode material over the second dielectric material.

Figure 1:
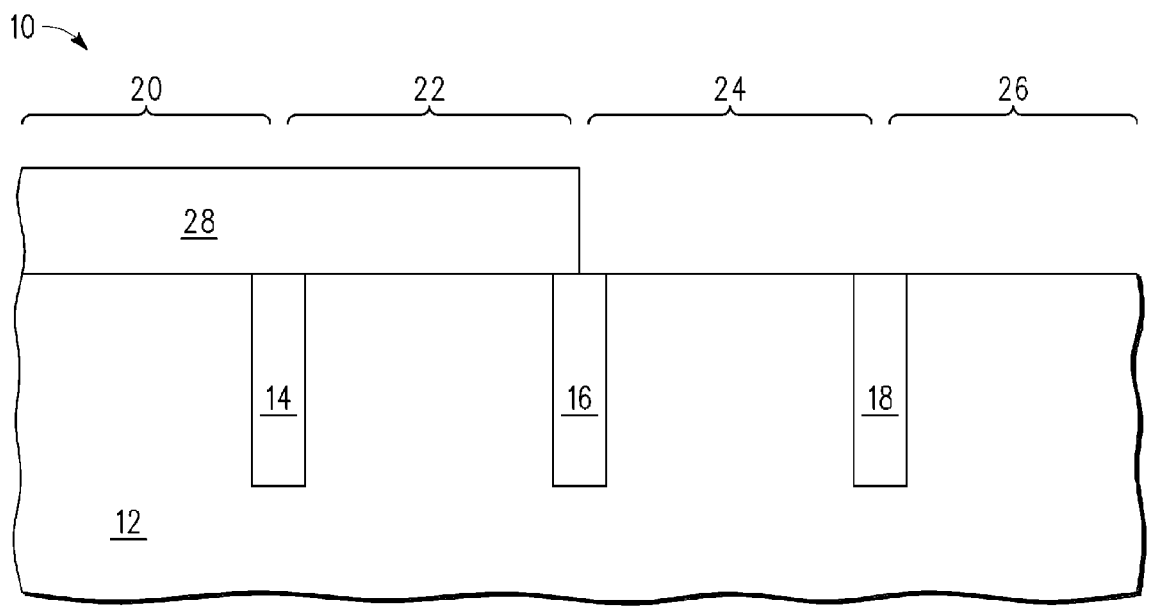
FIG. 1 is a view of a semiconductor device during a processing step.

FIG. 1 is a view of a semiconductor device 10 during a processing step. Semiconductor device 10 may include a semiconductor substrate 12. The semiconductor substrate described herein can be any semiconductor material or combinations of materials, such as gallium arsenide, silicon germanium, silicon-on-insulator (SOI), silicon, monocrystalline silicon, the like, and combinations of the above. Within substrate 12, trench isolation regions 14, 16, and 18 may be formed to isolate the different devices to be formed. Semiconductor device 10 may include an NMOS dual gate oxide (N-DGO) region 20, an NMOS core (N-Core) region 22, a PMOS dual gate oxide (P-DGO) region 24, and a PMOS core (P-Core) region 26. N-DGO region 20 and N-Core region 22 may be implanted with boron to form P-well regions (not shown). P-DGO region 24 and PMOS-Core region 26 may be implanted with arsenic or phosphorus to form N-well regions (not shown). NMOS devices may be formed in N-DGO region 20 and N-Core region 22. PMOS devices may be formed in P-DGO region 24 and P-Core region 26. The devices formed in the dual gate oxide regions (20 and 24) will be formed with thicker gate oxide and the devices formed in the core regions (22 and 26) will be formed with thinner gate oxide. Next, as shown in FIG. 1, a hard mask 28 may be formed over N-DGO region 20 and N-Core region 22.

Figure 2:
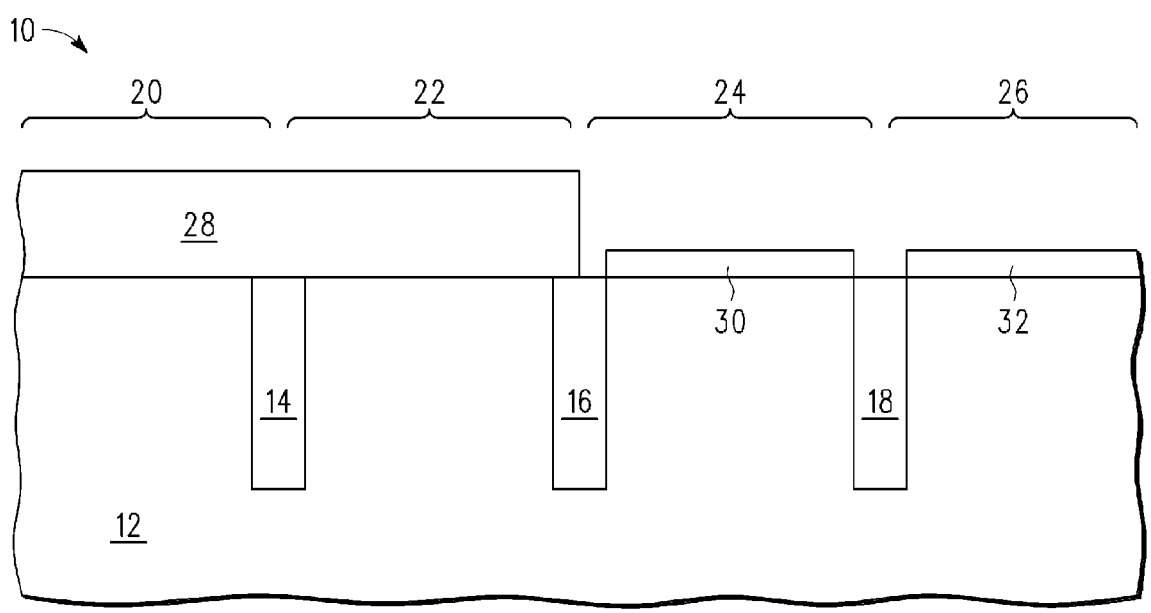
FIG. 2 is a view of a semiconductor device during a processing step.

FIG. 2 is a view of semiconductor device 10 during a processing step. As part of this processing step, silicon germanium regions 30 and 32 may be formed in P-DGO region 24 and P-Core region 26, respectively. In one embodiment, silicon germanium regions 30 and 32 may be epitaxially grown. By way of example, silicon germanium regions 30 and 32 may have a thickness in a range of 30 Angstroms to 150 Angstroms. In other embodiments, silicon germanium regions 30 and 32 may have a thickness in a range of 50 Angstroms to 100 Angstroms. In addition, silicon germanium regions 30 and 32 may have 10% to 50% germanium. In other embodiments, silicon germanium regions 30 and 32 may have 20% to 35% germanium. Although this step is described with respect for forming silicon germanium regions, any other semiconductor material that has a different electrical property from semiconductor substrate 12 may be used as part of this step. For example, in one embodiment, silicon carbon may be used. In one embodiment, any semiconductor material that changes a band gap of a channel region of a device formed in a region having that semiconductor material may be used. In another embodiment, any semiconductor material that changes a band gap of a channel region of a thick gate device relative to a channel region of a thin gate device may be used.

Figure 3:
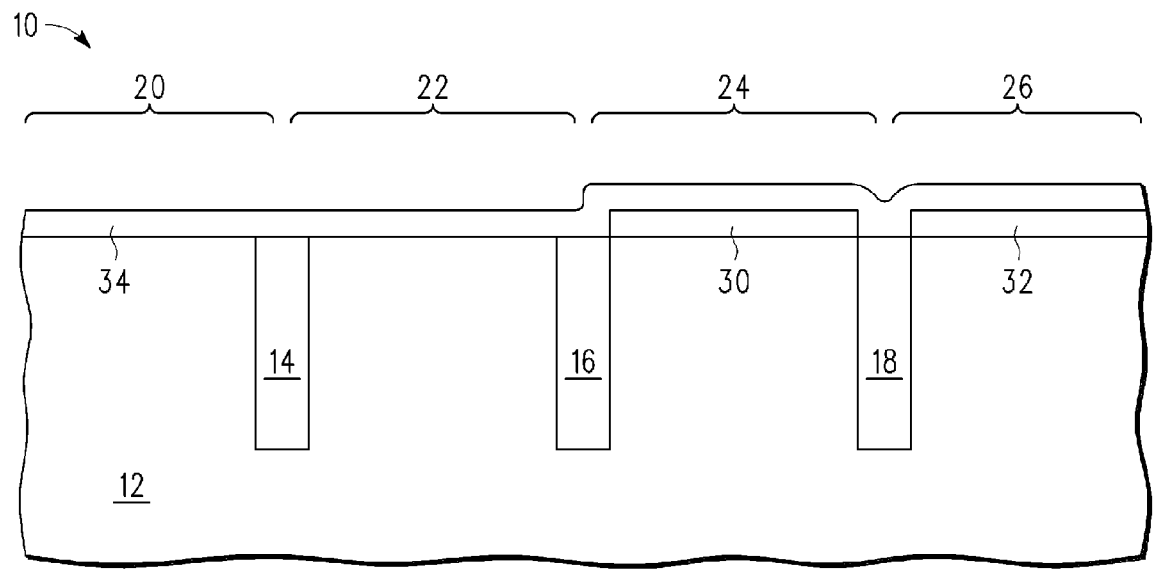
FIG. 3 is a view of a semiconductor device during a processing step.

FIG. 3 is a view of semiconductor device 10 during a processing step. As part of this processing step, a high temperature oxide (HTO) layer 34 may be formed. In one embodiment, HTO layer 34 may be formed by chemical vapor deposition at a temperature of approximately 800 degree Celsius. The range of temperature may vary from 750 degree Celsius to 900 degree Celsius. By way of example, HTO layer 34 may have a thickness in a range of 10 Angstroms to 50 Angstroms. In other embodiments, HTO layer 34 may have a thickness in a range of 20 Angstroms to 30 Angstroms. HTO layer 34 may be formed using other deposition processes, as well, such as atomic layer deposition, plasma enhanced chemical vapor deposition, and physical vapor deposition.

Figure 4:
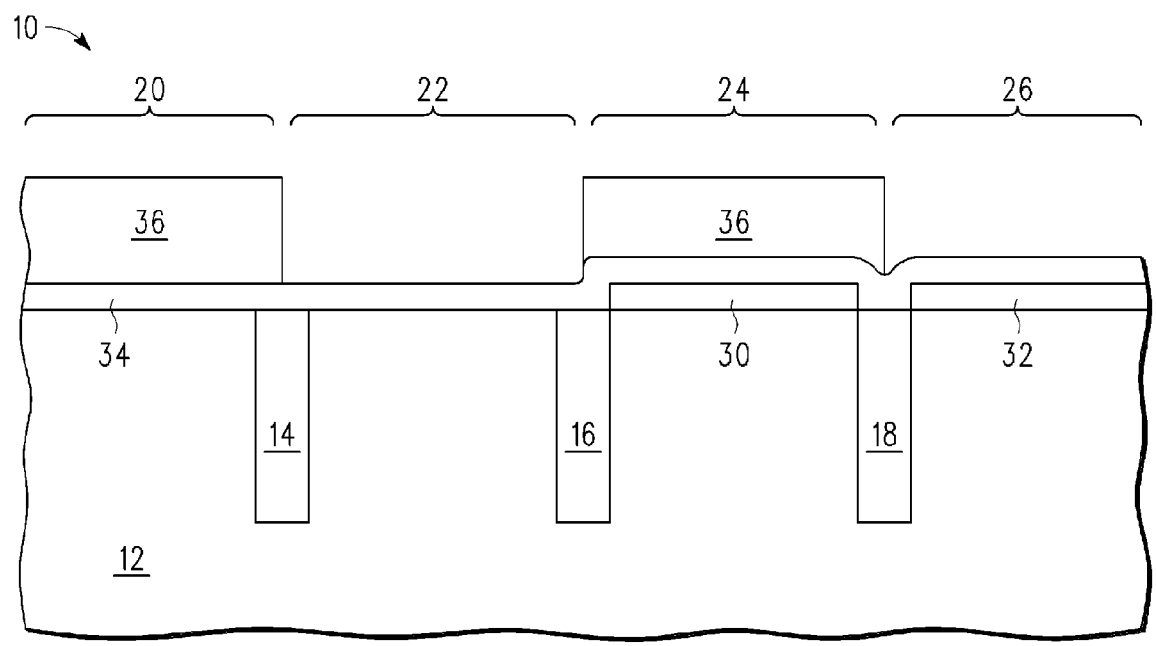
FIG. 4 is a view of a semiconductor device during a processing step.

FIG. 4 is a view of semiconductor device 10 during a processing step. As part of this processing step, patterned resist regions 36 may be formed overlying N-DGO region 20 and P-DGO region 24.

Figure 5:
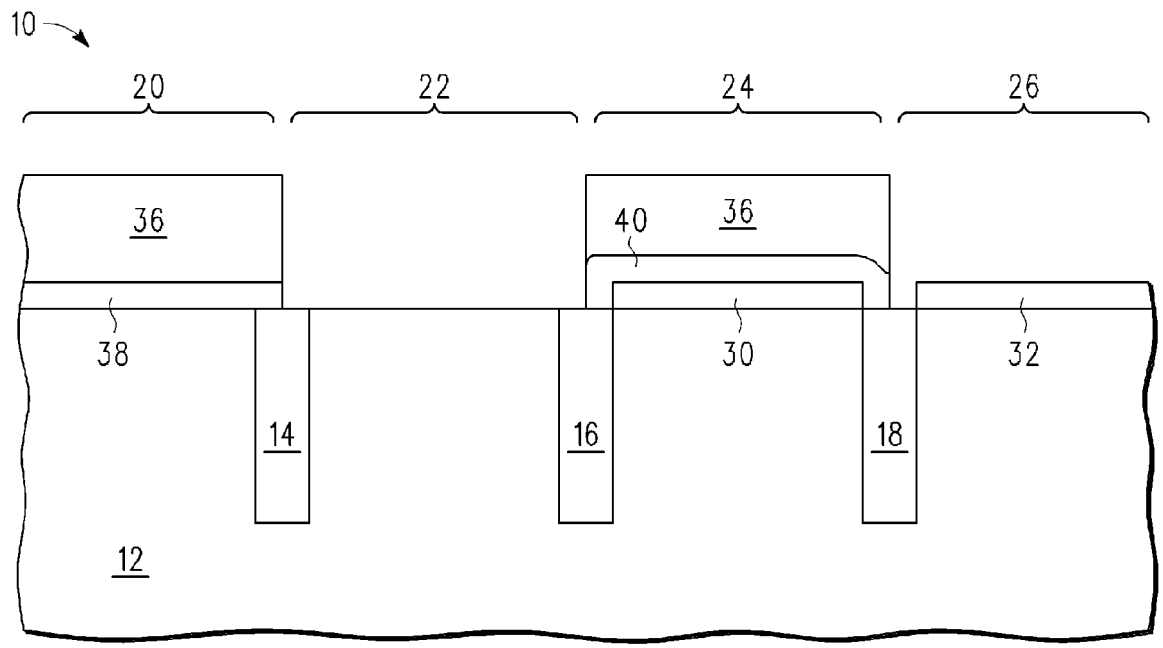
FIG. 5 is a view of a semiconductor device during a processing step.

Next, as shown in FIG. 5, using patterned resist regions 36, HTO layer 34 may be removed from core regions, including N-Core region 22 and P-Core region 26 leaving portions of HTO layer 34 only in DGO regions. Thus, for example, lower gate oxide region 38 and lower gate oxide region 40 may remain in N-DGO region 20 and P-DGO region 24. In one embodiment, HTO layer 34 may be removed from N-Core region 22 and P-Core region 26 using a hydrofluoric acid (HF) clean. In one embodiment, a diluted HF clean process may be used. Having removed HTO layer from N-Core region 22 and P-Core region 26, patterned resist regions 26 may be removed using piranha clean or solvent clean, for example.

Figure 6:
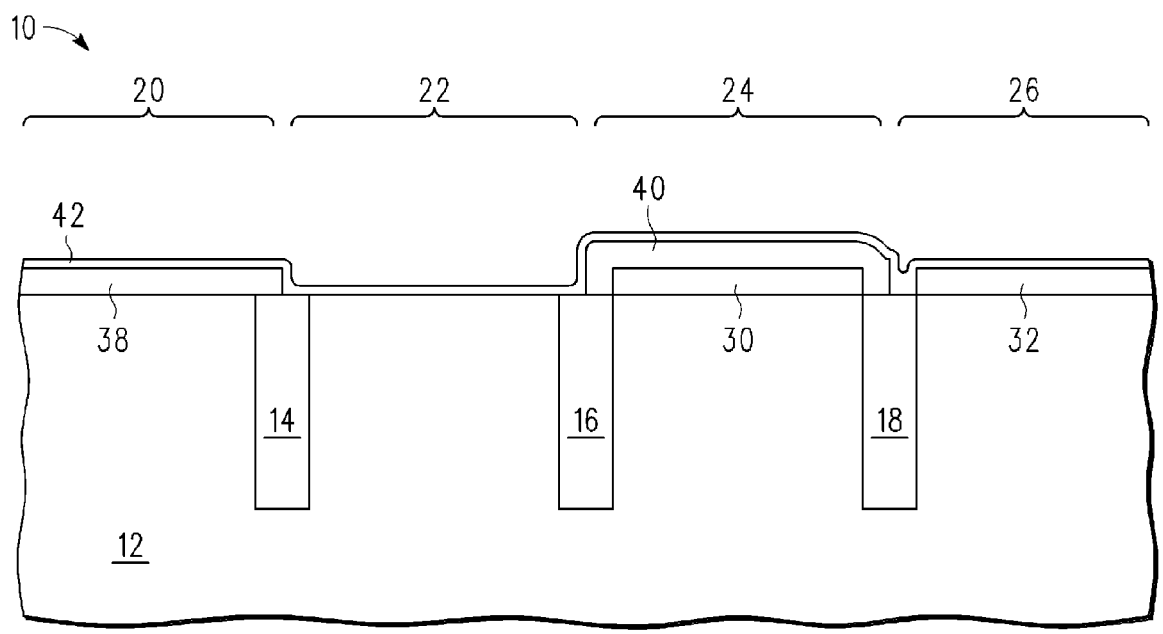
FIG. 6 is a view of a semiconductor device during a processing step.

Next, as shown in FIG. 6, a high k gate oxide layer 42 may be formed. In one embodiment, high k gate oxide layer 42 may overlie both core regions and DGO regions. Thus, for example, high k gate oxide layer 42 may directly overlie on lower gate oxide region 38 in N-DGO region 20, a portion of substrate 12 in N-Core region 22, lower gate oxide region 40 in P-DGO region 24, and silicon germanium region 32 in P-Core region 26. In one embodiment, high k gate oxide layer 42 may be deposited using an atomic layer deposition process. Prior to deposition of high k gate oxide layer 42, the top surfaces of the relevant regions may be pre-cleaned. As used herein the term high k gate oxide includes any oxide material with k in a range of 10-100. In one embodiment, any oxide material with k in a range of 15-25 may also be used. Suitable materials for forming high k gate oxide layer 42 include hafnium oxide, hafnium silicate, hafnium aluminate, zirconium oxide, zirconium silicate, and other suitable high-k materials. In one embodiment, high-k gate oxide layer 42 may have a thickness in a range of 10 Angstroms to 50 Angstroms. In another embodiment, high-k gate oxide layer 42 may have a thickness in a range of 15 Angstroms to 20 Angstroms.

Figure 7:
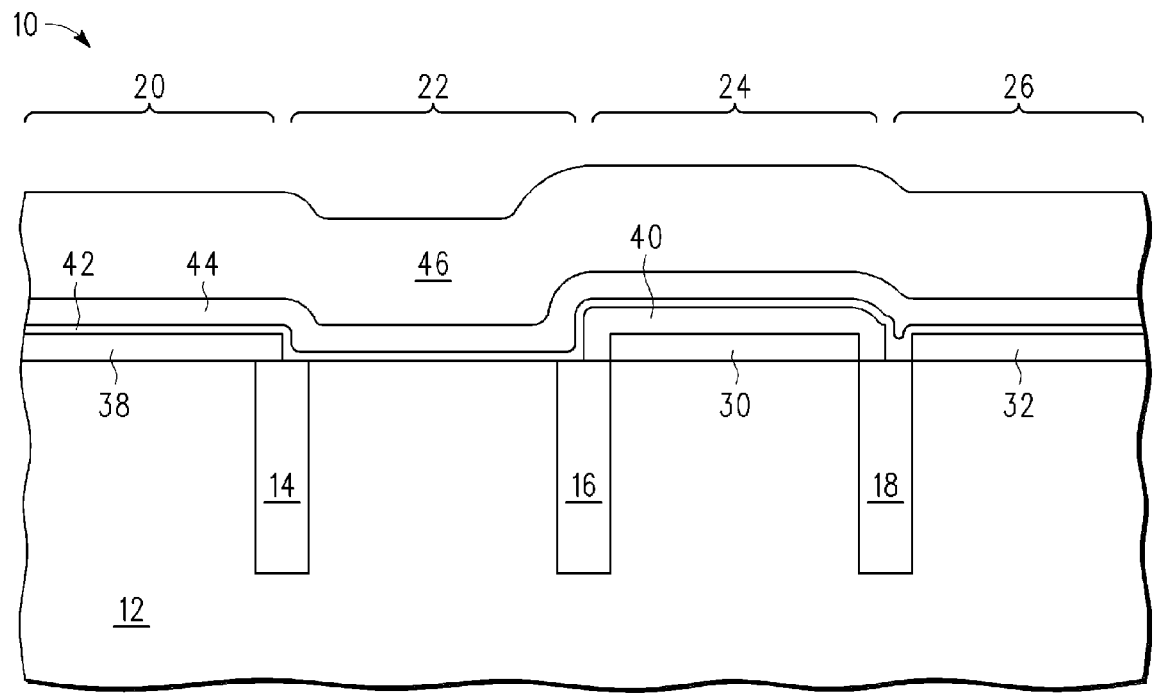
FIG. 7 is a view of a semiconductor device during a processing step.

Next, as shown in FIG. 7, a metal gate electrode layer 44 may be formed overlying high k gate oxide layer 42. In one embodiment, metal gate electrode layer 44 may contain an element or alloy. By way of example, metal gate electrode layer 44 may contain tantalum, titanium, lanthanum, molybdenum, or any combination thereof. Metal gate electrode layer 44 may further contain carbon and/or nitrogen. Metal gate electrode layer 44 may be formed using processes, such as atomic layer deposition (ALD), molecular beam deposition (MBD), and chemical vapor deposition (CVD). By way of example, metal gate electrode layer 44 may have a thickness in a range of 20 Angstroms to 150 Angstroms. In another embodiment, metal gate electrode layer 44 may have thickness in a range of 50 Angstroms to 100 Angstroms.

Referring still to FIG. 7, after formation of metal gate electrode layer 44, a polysilicon gate electrode layer 46 may be formed over metal gate electrode layer 44. Polysilicon gate electrode layer 46 may be formed using processes, such as atomic layer deposition (ALD), molecular beam deposition (MBD), and chemical vapor deposition (CVD). By way of example, polysilicon gate electrode layer 46 may have a thickness in a range of 200 Angstroms to 1000 Angstroms. In another embodiment, polysilicon gate electrode layer 46 may have thickness of 500 Angstroms.

Figure 8:
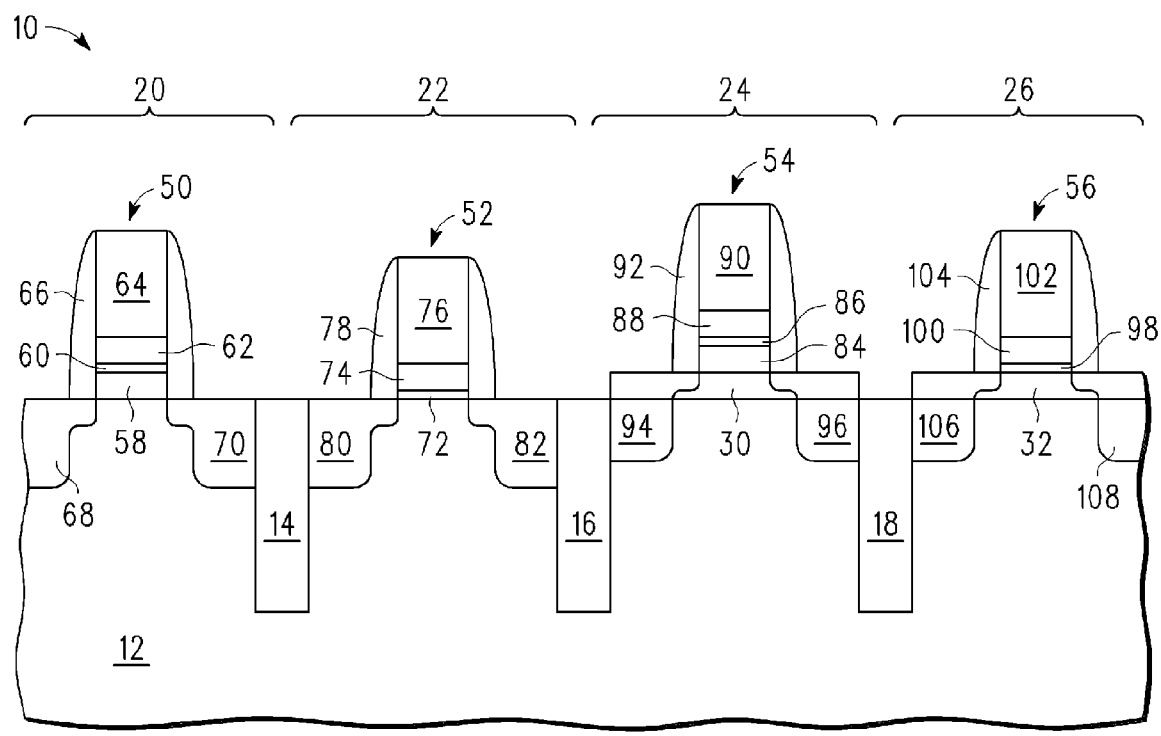
FIG. 8 is a view of a semiconductor device during a processing step.

FIG. 8 is a view of semiconductor device 10 after formation of PMOS and NMOS devices. By way of example, N-DGO device 50 may be formed in N-DGO region 20, N-Core device 52 may be formed in N-Core region 22, P-DGO device 54 may be formed in P-DGO region 24, and P-Core device 56 may be formed in P-Core region 26. These devices may be formed by forming gate electrodes, spacers, and source/drain regions using conventional semiconductor processing steps. Thus, for example, N-DGO device 50 may include a gate structure including a lower gate oxide region 58, an upper gate oxide region 60 (formed from the high k gate oxide material), a metal gate electrode region 62, and a polysilicon gate electrode region 64. N-DGO device 50 may further include a spacer 66 formed adjacent to the gate structure. N-DGO device 50 may further include source/drain regions 68 and 70. N-Core device 52 may include a gate structure including a gate oxide region 72 (formed from the high k gate oxide material), a metal gate electrode region 74, and a polysilicon gate electrode region 76. N-Core device 52 may further include a spacer 78 formed adjacent to the gate structure. N-Core device 52 may further include source/drain regions 80 and 82. P-DGO device 54 may include silicon germanium region 30. P-DGO device 54 may further include a gate structure including a lower gate oxide region 84, an upper gate oxide region 86 (formed from the high k gate oxide material), a metal gate electrode region 88, and a polysilicon gate electrode region 90. P-DGO device 54 may further include a spacer 92 formed adjacent to the gate structure. P-DGO device 54 may further include source/drain regions 94 and 96. P-Core device 56 may include silicon germanium region 32. P-Core device 56 may further include a gate structure including a gate oxide region 98 (formed from the high k gate oxide material), a metal gate electrode region 100, and a polysilicon gate electrode region 102. P-Core device 56 may further include a spacer 104 formed adjacent to the gate structure. P-Core device 56 may further include source/drain regions 106 and 108.

Although the invention has been described with respect to specific conductivity types or polarity of potentials, skilled artisans appreciated that conductivity types and polarities of potentials may be reversed. Thus, for example, although the process flow is described above with respect to PMOS devices having silicon germanium regions, a similar process flow may be used with NMOS devices having silicon carbon.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming devices comprising:
   forming a first region and a second region in a semiconductor substrate;
   forming a semiconductive material over the first region, wherein the semiconductive material has a different electrical property than the semiconductor substrate;
   forming a first dielectric material over the first region;
   depositing a second dielectric material over the first dielectric material and over the second region, wherein the second dielectric material is different than the first dielectric material; and
   depositing a gate electrode material over the second dielectric material.

2. The method of claim 1 further comprising:
   forming a third region and a fourth region in the semiconductor substrate; wherein:
   forming the semiconductive material over the first region further comprises forming the semiconductive material over the third region;
   forming the first dielectric material over the first region further comprises forming the first dielectric material over the fourth region; and
   depositing the second dielectric material over the first dielectric material and over the second region further comprises depositing the second dielectric material over the third region.

3. The method of claim 2, wherein forming the semiconductive material over the first region, further comprises epitaxially growing the semiconductive material.

4. The method of claim 1, wherein depositing the first dielectric material occurs at a temperature between approximately 750 degrees Celsius and approximately 900 degrees Celsius.

5. The method of claim 1 further comprising:
   implanting the first region with a first dopant, wherein the first region has a first conductivity; and
   implanting the second region with a second dopant, wherein the second region has a second conductivity, and wherein the first conductivity and the second conductivity are a same conductivity.

6. The method of claim 1, further comprising:
   implanting the first region with a first dopant, wherein the first region has a first conductivity; and
   implanting the second region with a second dopant, wherein the second region has a second conductivity and the first conductivity and the second conductivity are different conductivities.

7. The method of claim 2 further comprising:
   implanting the first region and the third region with a first dopant, wherein the first region and the third region have a first conductivity; and
   implanting the second region and the fourth region with a second dopant, wherein the second region and the fourth region have a second conductivity and wherein the first conductivity is different from the second conductivity.

8. The method of claim 1, wherein forming the semiconductive material further comprises forming the semiconductor material comprising a material selected from the group consisting of germanium and carbon.

9. The method of claim 8, wherein forming the semiconductive material comprises forming the semiconductive material comprising a material selected from the group consisting of silicon germanium and silicon carbon.

10. The method of claim 1, wherein forming the first dielectric material over the first region further comprises depositing the first dielectric material.

11. The method of claim 1, wherein the second dielectric material comprises a high dielectric constant material.

12. A method of forming devices comprising:
   forming a thick gate dielectric device in a first region of a semiconductor substrate, wherein the thick gate dielectric device has a first channel region and the semiconductor substrate comprises a first material;
   forming a thin gate dielectric device in a second region of a semiconductor substrate, wherein the thin gate dielectric device has a gate dielectric that is thinner than that of the thick gate dielectric device, the thin gate dielectric device has a second channel region and forming the thick gate dielectric device and the thin gate dielectric device further comprises:
      epitaxially growing the first channel region over the first region, wherein the first channel region comprises a second material, wherein the second material is different from the first material;
      forming a first gate dielectric over the first channel region;

forming a second gate dielectric over the first gate dielectric and the second region; and depositing a gate electrode material over the second gate dielectric.

13. The method of claim 12, wherein the second material changes band gap of the first channel region relative to the second channel region.

14. The method of claim 12, wherein the second material comprises a material selected from the group consisting of silicon germanium and silicon carbon.

15. The method of claim 12, wherein the second gate dielectric comprises a high dielectric constant material.

16. The method of claim 12, wherein forming the first gate dielectric comprises depositing the first gate dielectric.

17. The method of claim 16, wherein depositing the first gate dielectric further comprises chemically vapor depositing the first gate dielectric at a temperature between approximately 750 and approximately 900 degrees Celsius.

18. The method of claim 12, wherein the semiconductor substrate further comprises a third region and a fourth region and the method further comprises:

forming a second thick gate dielectric device in the third region, wherein the second thick gate dielectric device has a third channel region, forming a second thin gate dielectric device in the fourth region, wherein the second thin gate dielectric device has a fourth channel region and the second thin gate dielectric device has a gate dielectric that is thinner than that of the second thick gate dielectric device; and wherein:

epitaxially growing the first channel region further comprises epitaxially growing the fourth channel region;

forming the first gate dielectric further comprises forming the first gate dielectric over the third channel region; and forming the second gate dielectric further comprises forming the second gate dielectric over the fourth region.

19. The method of claim 18 further comprising:

implanting the first region and second region with a first dopant, wherein the first region and the second region have a first conductivity; and implanting the third region and fourth region with a second dopant, wherein the third region and the fourth region have a second conductivity and wherein the first conductivity is different from the second conductivity.

20. A method comprising:

forming an isolation region in a semiconductor substrate to form a first semiconductive region and a second semiconductive region in a semiconductor substrate;

epitaxially growing a semiconductive material over the first semiconductive region, wherein the semiconductive material comprises an element selected from a group consisting of germanium and carbon;

depositing a first dielectric material over the first semiconductive region;

depositing a second dielectric material over the first dielectric material and the second semiconductive region; and depositing a gate electrode material over the second dielectric material.

* * * * *